United States Patent
Pant et al.

(10) Patent No.: US 8,975,891 B2
(45) Date of Patent: Mar. 10, 2015

(54) APPARATUS AND METHOD FOR DETERMINING IN-PLANE MAGNETIC FIELD COMPONENTS OF A MAGNETIC FIELD USING A SINGLE MAGNETORESISTIVE SENSOR

(75) Inventors: Bharat B. Pant, Minneapolis, MN (US); Lakshman Withanawasam, Maple Grove, MN (US)

(73) Assignee: Honeywell International Inc., Morristown, NJ (US)

(*) Notice: Subject to any disclaimer, the term of this patent is extended or adjusted under 35 U.S.C. 154(b) by 796 days.

(21) Appl. No.: 13/289,804

(22) Filed: Nov. 4, 2011

(65) Prior Publication Data

US 2013/0116943 A1    May 9, 2013

(51) Int. Cl.
    G01R 33/09    (2006.01)
(52) U.S. Cl.
    CPC .................................. *G01R 33/098* (2013.01)
    USPC ....................................................... 324/252
(58) Field of Classification Search
    USPC ....................................................... 324/252
    See application file for complete search history.

(56) References Cited

U.S. PATENT DOCUMENTS

| | | | |
|---|---|---|---|
| 3,919,630 A | 11/1975 | Oshima | |
| 7,541,804 B2 | 6/2009 | Chung | |
| 7,683,610 B2* | 3/2010 | Shimazawa | 324/210 |
| 7,808,749 B2 | 10/2010 | Kou | |
| 2002/0109172 A1* | 8/2002 | Okazawa | 257/298 |
| 2003/0035249 A1 | 2/2003 | Ho | |
| 2004/0137275 A1 | 7/2004 | Jander | |
| 2005/0283988 A1 | 12/2005 | Sato | |
| 2009/0279212 A1 | 11/2009 | Engel | |
| 2010/0276389 A1 | 11/2010 | Mather | |

OTHER PUBLICATIONS

Nozieres, "Blocking Temperature Distribution and Long-Term Stability of Spin-Valve Structures With MN-Based Antiferromagnets", "Journal of Applied Physics", Jan. 7, 2000, pp. 3920-3925, vol. 87, No. 8, Publisher: American Institute of Physics.
Primdahl, "The Fluxgate Magnetometer", "Journal of Physics E: Scientific Instruments", 1979, pp. 241-253, vol. 12.
Rickart, "Exchange Coupling of Bilayers and Synthetic Antiferromagnets Pinned to MNPT", "The European Physical Journal B", Mar. 8, 2005, pp. 1-6, Publisher: EDP Sciences.

* cited by examiner

*Primary Examiner* — Jay Patidar
(74) *Attorney, Agent, or Firm* — Fogg & Powers LLC

(57) ABSTRACT

A method to measure an applied magnetic field in a plane is provided. The method includes simultaneously applying a first and second alternating drive current to a respective first and second strap overlaying a magnetoresistive sensor so the magnetoresistive sensor is subjected to a periodically rotating magnetic drive field rotating in the plane in the magnetoresistive sensor. When the applied magnetic field to be measured is superimposed on the periodically rotating magnetic drive field rotating in the plane, the method includes extracting a second harmonic component of an output voltage output from the magnetoresistive sensor. The magnitude of the magnetic field to be measured in the plane is proportional to an amplitude of the extracted second harmonic component of the output voltage. The orientation of the magnetic field to be measured in the plane is related to a phase angle of the extracted second harmonic component of the output voltage.

20 Claims, 12 Drawing Sheets

APPARATUS AND METHOD FOR DETERMINING IN-PLANE MAGNETIC FIELD COMPONENTS OF A MAGNETIC FIELD USING A SINGLE MAGNETORESISTIVE SENSOR

BACKGROUND

It is desirable to be able to sense two components of a planar field using batch fabricated devices on the same substrate without the need of sawing and packaging. Currently available technology solves this problem by annealing-in orthogonal Pinned Layer/Reference Layer (PL/RL) magnetization directions on neighboring tunnel junctions.

Magnetic tunnel junctions have high magnetoresistance ratio (i.e., $(R_{max}-R_{min})/R_{min}=\Delta R/R$) on the order of 100's of % and are currently used to measure moderate to high levels of magnetic fields. Magnetic tunnel junctions also have a high 1/f noise. The high noise density at low frequencies prevents the use of magnetic tunnel junctions for measuring small levels of magnetic field at frequencies less than of the order of a kHz.

SUMMARY

The present application relates to a method to measure an applied magnetic field in a plane. The method includes applying a first alternating drive current to a first strap. At least a portion of the first strap overlays a magnetoresistive sensor. The first strap has a dimension extending in a first direction. The method also includes simultaneously applying a second alternating drive current to a second strap. At least a portion of the second strap overlays the at least a portion of the first strap. The second strap has a dimension extending in a second direction. The second direction is non-parallel to the first direction and the second alternating drive current is out of phase with respect to the first alternating drive current so the magnetoresistive sensor is subjected to a periodically rotating magnetic drive field rotating in the plane in the magnetoresistive sensor. When the applied magnetic field to be measured is superimposed on the periodically rotating magnetic drive field rotating in the plane, the method further includes extracting a second harmonic component of an output voltage output from the magnetoresistive sensor. The magnitude of the magnetic field to be measured in the plane is proportional to an amplitude of the extracted second harmonic component of the output voltage. The orientation of the magnetic field to be measured in the plane is related to a phase angle of the extracted second harmonic component of the output voltage.

The details of various embodiments of the claimed invention are set forth in the accompanying drawings and the description below. Other features and advantages will become apparent from the description, the drawings, and the claims.

DRAWINGS

Like reference numbers and designations in the various drawings indicate like elements.

DETAILED DESCRIPTION

Figure 1A:
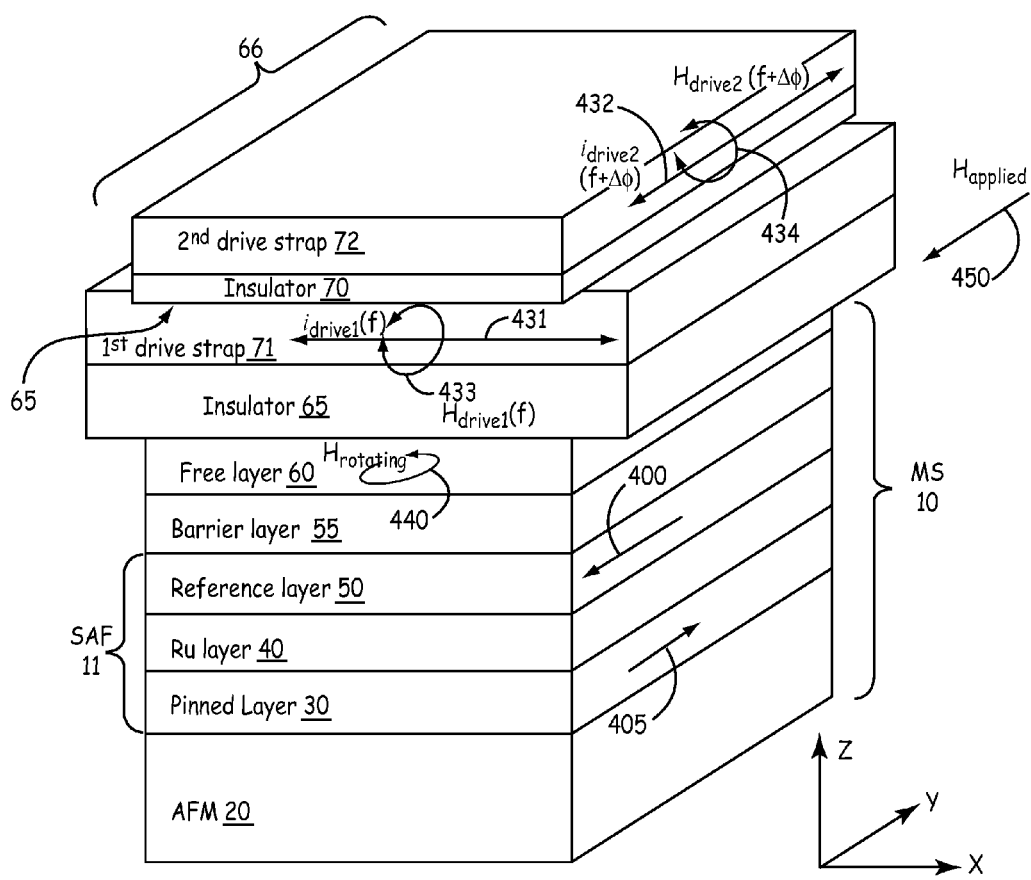
FIG. 1A is a block diagram of one embodiment of a multilayered magnetoresistive sensor, a first drive strap, and a second drive strap in accordance with the present invention.

MagnetoResistive (MR) sensors are used for magnetic compassing, magnetic anomaly detection, gear-tooth sensing, etc., i.e., in any application where small values of magnetic field, or small changes in Earth's magnetic field must be sensed. Fluxgates and Superconducting Quantum Interference Devices (SQUIDs) are bulk level magnetic sensors capable of measuring small values of magnetic field or small changes in magnetic fields.

Chip scale magnetoresistive sensors can be made at low cost and are thus advantageous over bulk level magnetic sensors. Anisotropic MagnetoResistance (AMR) sensors, Giant MagnetoResistance (GMR) sensors and Magnetic Tunnel Junction (MTJ) sensors are manufactured on a chip scale. GMR and MTJ stacks include a ferromagnetic free layer of which the magnetization orientation can be changed, a ferromagnetic reference layer having a fixed magnetization orientation, and a barrier layer therebetween. Anisotropic magnetoresistors have magnetoresistive ratios $\Delta R/R$ of about 2-3%. Giant magnetoresistors advantageously provide higher magnetoresistive ratios $\Delta R/R$ on the order of 10's of %. Magnetic tunnel junctions provide even higher magnetoresistive (MR) ratios on the order of 100's of %.

Another advantage of chip scale GMR or MTJ sensors is their small size. For example, multilayered magnetoresistive sensors (GMR or MTJ) can have dimensions of the order of a few 10's to 100's of nanometers. A 200 nm wide metal line overlaying a 100-150 nm wide MTJ has a "field conversion factor" of 32 µAmp/Oe, and a micron wide line has a field conversion factor of 159 µAmp/Oe. Thus, fields required to switch, rotate, or saturate the free layer of an appropriately built multilayered magnetoresistive sensor can be produced by applying modest currents to such a sensor using simpler Application-Specific Integrated Circuits (ASICs) consuming modest power consumption.

However, noise power spectral density (including the 1/f and Barkhausen noise components) of multilayered magnetoresistive (GMR or MTJ) sensors is higher than that of AMR sensors. For magnetic changes occurring at low frequencies, the 1/f noise dominates, thus the higher magnetoresistance ratios of multilayered magnetoresistive sensors do not translate into correspondingly higher signal-to-noise ratios. In order to translate the high magnetoresistance ratios of multilayered magnetoresistive sensors into a low minimum detectable field (mdf) or noise equivalent field resolution, it is necessary to improve the signal-to-noise (SN) ratio. At frequencies above the knee of a 1/f noise versus frequency plot, the signal-to-noise (SN) ratio increases.

Embodiments of systems and methods to improve the signal-to-noise ratio of multilayered magnetoresistive sensors and to measure in-plane magnetic field components of a magnetic field using a single multilayered magnetoresistive sensor are described. As defined herein, the "magnetic field components of a magnetic field in a plane" are the projection of the magnetic field onto the basis vectors spanning the plane (axes of the plane). For example, the magnetic field components of a magnetic field in an X-Y plane are the projections of the magnetic field onto the X axis and the Y axis. As defined herein, the "applied magnetic field in an X-Y plane" is the applied magnetic field projected onto the X-Y plane. The terms "X-Y plane", "planar field", and "selected plane" are used interchangeably herein. The in-plane magnetic field components of a magnetic field provide an orientation and magnitude of the magnetic field in the selected plane. Specifically, an X-component and a Y-projection of the magnetic field provide information indicative of the orientation and magnitude of the magnetic field in the selected plane. The sensor systems described herein take advantage of unique properties of magnetic tunnel junctions and/or giant magnetoresistors that enable low cost, and low power consumption with high resolution. The term multilayered magnetoresistive (MR) sensor as used herein applies to both magnetic tunnel junction sensors and giant magnetoresistor sensors that have magnetoresistance ratios greater than AMR sensors.

The magnetoresistive sensor systems described herein differ from prior art in that the orientation and magnitude of an in-plane applied magnetic field are measured using a single tunnel junction, which can be fabricated on wafer using the same annealing-in of the orthogonal PL/RL magnetization directions for all the tunnel junctions on the wafer. Thus, the tunnel junctions described herein do not need to create orthogonal directions of pinned layer/reference layer magnetizations as is done in the prior art. As defined herein, the "applied magnetic field" is a magnetic field that is incident on (applied to) the magnetoresistive sensor from a source external to the magnetoresistive sensor system. In the magnetoresistive sensor systems described herein, a periodically rotating magnetic drive field is generated in the free layer of the magnetoresistive sensor. The periodically rotating magnetic drive field is large enough to saturate the free layer but small enough that the synthetic antiferromagnet of the magnetoresistive sensor is generally unaffected. Thus, the free layer rotates with the period of the rotating magnetic drive field.

In the presence of additional external DC (or low frequency) field, the sensor output of the magnetoresistive sensor develops a second harmonic component that is detected using phase-sensitive detection techniques. The amplitude and phase angle of the second harmonic component are functions of the magnitude and orientation of the external field, respectively, thus allowing for determination of both components of the in-plane field. The detection circuitry can be either external to the sensor chip, or can be integrated on Silicon with the MTJ using complementary metal oxide semiconductor (CMOS) process.

FIG. 1A is a block diagram of one embodiment of a multilayered MagnetoResistive (MR) sensor 10, a first drive strap 71, and a second drive strap 72 in accordance with the present invention. At least a portion 65 of the first drive strap 71 (also referred to herein as first strap 71) overlays the magnetoresistive sensor (MS) 10 to carry a first alternating drive current. The first drive strap 71 has a dimension extending in a first direction. As shown in FIG. 1A, the first direction is parallel to the X axis. At least a portion 66 of the second drive strap 72 (also referred to herein as second strap 72) overlays the magnetoresistive sensor 10 and the portion 65 of the first drive strap 71 to carry a second alternating drive current. The second drive strap 72 has a dimension extending in a second direction, the second direction being perpendicular to the first direction. As shown in FIG. 1A, the second direction is parallel to the Y axis. Thus, the second strap 72 overlays and is perpendicular to the first strap 71. The second alternating drive current is ninety degrees out of phase with respect to the first alternating drive current so the magnetoresistive sensor 10 is subjected to a periodically rotating drive field rotating in the X-Y plane of the magnetoresistive sensor 10. In one implementation of this embodiment, the first direction and the second direction are not orthogonal (are non-parallel) and, in this case, the second alternating drive current is out of phase with respect to the first alternating drive current by an amount that will generate a periodically rotating drive field in a selected plane. However, this non-orthogonal system requires additional computation and adds complexity to the system.

The multilayered MR sensor 10 includes an antiferromagnet (AFM) 20, a synthetic antiferromagnet (SAF) 11, a barrier layer 55, and a free layer 60 stacked from bottom to top. The synthetic antiferromagnet 11 includes a ferromagnetic pinned layer 30, a Ru layer 40, and a reference layer 50 stacked from bottom to top. The "barrier layer 55" is also referred to herein as "barrier 55". The barrier 55 is an oxide insulator barrier if the sensor 10 is a magnetic tunnel junction sensor. The barrier 55 is a conductive non-magnetic metal layer if the sensor 10 is a GMR sensor.

The reference layer magnetization 400 of the reference layer 50 in a properly designed AFM/SAF structure is "fixed", i.e., an applied magnetic field (up to a high level, typically ~kOe) does not significantly change the reference layer magnetization 400. Thus, the reference layer 50 is a referred to as a hard layer. In the exemplary magnetoresistive sensor 10 shown in FIG. 1A, the reference layer magnetization 400 of the reference layer 50 is parallel to the Y axis.

The reference layer 50 lies directly under the barrier 55, which separates the reference layer 50 from a free layer 60. The free layer is very soft so its magnetization can be driven into saturation with the application of modest drive fields. The periodically rotating drive field $H_{rotating}$ and any applied magnetic field $H_{applied}$ 450 easily change the magnetization of the free layer 60. Thus, the free layer 60 is referred to as a soft layer.

The magnetic susceptibility of the free layer 60 is a result of the net sum of all the magnetic interactions at the free layer 60. This includes free layer's material and shape anisotropy as well as fields from the other layers comprising the Tunnel Junction. A free layer with a circular profile advantageously eliminates in-plane shape anisotropy, although ideas incorporated in this patent will work well with other geometries, e.g., square or rectangular. It is assumed here that with a combination of materials, processing, and geometric choices a very soft free layer is obtained. Such materials, processing and geometric choices are generally familiar to one skilled in the arts.

As shown in FIG. 1A, the first alternating drive current $i_{drive1}(f)$ generates a first magnetic drive field $H_{drive1}$ (f) while the second alternating drive current $i_{drive2}(f+\Delta\phi)$ generates a second magnetic drive field $H_{drive2}(f+\Delta\phi)$, where $\Delta\phi$ is $\pi/2$ radians. The first alternating drive current $i_{drive1}(f)$ can be written as $I_x(f)=I_1 \sin(\omega t)$ while the second alternating drive current $i_{drive2}(f+\Delta\phi)$ is written as $I_y(f)=I_2 \cos(\omega t)$. The effects of the first magnetic drive field $H_{drive1}(f)$ and the second magnetic drive field $H_{drive2}(f+\Delta\phi)$ and the externally applied magnetic field $H_{applied}$ 450 on the free layer magnetization are described below with reference to FIGS. 4 and 5. The externally applied magnetic field $H_{applied}$ 450 is the field to be measured by the magnetic sensor 10. The terms "applied magnetic field" and "magnetic field to be measured" are used interchangeably herein. The applied magnetic field $H_{applied}$ 450 can be a weak DC magnetic field or a weak magnetic field changing at low frequency that is much less than the drive frequency f.

The AFM 20 is typically made of an alloy such as NiMn, PtMn, IrMn or FeMn. Exchange bias is created on the pinned layer 30 by annealing SAF/AFM 11/20 in a field of the order of kOe at temperatures in the range of approximately 200° C.-350° C. for a few hours. This sets the direction of uncompensated spins in AFM 20 at the interface between AFM 20 and pinned layer 30 thus providing a bias field to the pinned layer 30. The strong antiferromagnetic coupling between the pinned layer 30 and reference layer 50 sets the direction of reference layer magnetization 400 opposite to that of pinned layer magnetization 405. The net magnetization of SAF 11 is tailored to be nearly zero. Thus, high applied fields of the order of several kOe are required to change the magnetization of pinned layer/reference layer pair 30/50.

The resistance R of the magnetoresistive sensor 10 is a function of the angle between the reference layer magnetization 400 and the free layer magnetization according to the formula $R(\theta)=R_0+\Delta R(1-\cos\theta)/2$, $\theta$ being the angle between the reference layer magnetization 400 and free layer magnetization. $R_0$ is the resistance of the magnetoresistive sensor 10 when the magnetizations of the two layers are parallel. Thus, when only the rotating magnetic drive field $H_{rotating}$ 440 (also referred to herein as magnetic drive field $H_D$ 440) large enough to saturate the free layer is applied to sensor 10, the rotation of the free layer magnetization under the influence of this applied rotating drive field $H_{rotating}$ 440 produces a periodic magnetoresistance.

Figure 1B:
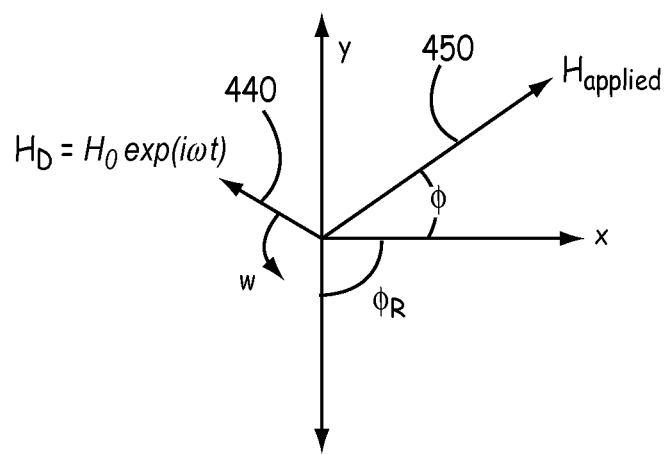
FIG. 1B shows the magnetic drive field periodically rotating at an angular frequency in the X-Y plane of the magnetoresistive sensor of FIG. 1A.

FIG. 1B shows the magnetic drive field $H_D$ 440 periodically rotating at an angular frequency $\omega$ in the X-Y plane of the magnetoresistive sensor 10 of FIG. 1A. As defined herein, a "periodically rotating drive field" is a magnetic drive field periodically rotating at an angular frequency $\omega$ indicated as $H_{rotating}=H_D=H_0 e^{i\omega t}$, where $H_0$ is the magnitude of the magnetic drive field $H_D$ 440. The tip of the vector $H_0$ traces a circle in the X-Y plane with each rotation. All angles are measured with respect to the X axis of the X-Y coordinate system of the plane. The reference layer magnetization 400 is at an angle $\phi_R$ with respect to the X axis. As shown in FIG. 1B, the externally applied magnetic field $H_{applied}$ to be measured is in the X-Y plane at an angle $\phi$ with respect to the X axis.

Figure 2A:
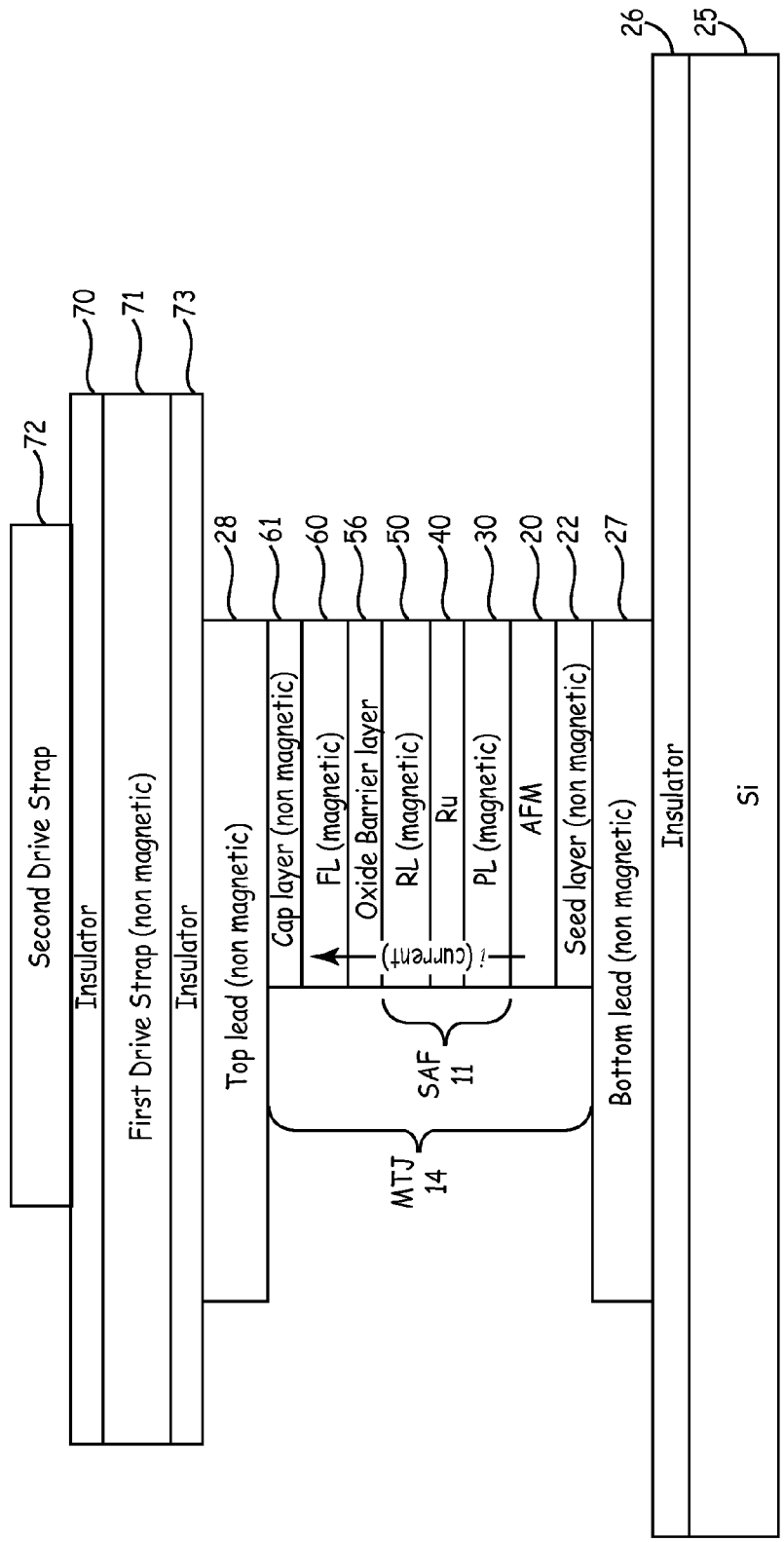
FIG. 2A is a block diagram of one embodiment of a magnetic tunnel junction, electrical contacts, a first drive strap, and a second drive strap in accordance with the present invention.
Figure 3A:
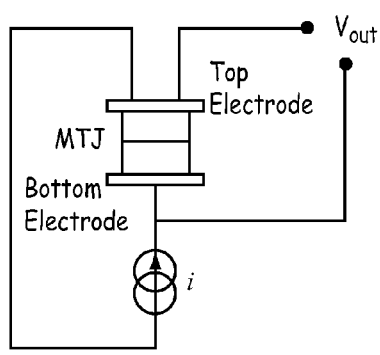
FIG. 3A is a block diagram of one embodiment of a circuit to measure output voltage of the magnetic tunnel junction of FIG. 2A in accordance with the present invention.

FIG. 2A is a block diagram of one embodiment of a magnetic tunnel junction 14, electrical contacts 27 and 28, a first drive strap 71, and a second drive strap 72 in accordance with the present invention. The magnetic tunnel junction (MTJ) 14 is a magnetoresistive sensor 10 as shown in FIG. 1A. The barrier layer 55 shown in FIG. 1A is an oxide barrier layer 56 in the magnetic tunnel junction 14. A non-magnetic cap layer 61 overlays the free layer (FL) 60 of the magnetic tunnel junction 14. The electrical contact (bottom lead) 27 overlays an insulator 26 on a silicon (Si) substrate 25. A non-magnetic seed layer 22 overlaying the electrical contact 27 is used to facilitate growth of the AFM layer 20. The electrical contact (top lead) 28 overlays the cap layer 61. An insulator layer 73 isolates the electrical contact 28 from the first drive strap 71, which is covered by an insulator layer 70. At least a portion of the second drive strap 72 overlays the insulator layer 70 and at least a portion of the first drive strap 71. The electrical contacts 27 and 28 are configured to connect the magnetic tunnel junction 14 to a circuit to measure the magnetoresistance $R(\theta)$ of the magnetic tunnel junction 14. As shown in FIG. 2A, the current is directed from the bottom lead (electrical contact 27) to the top lead (electrical contact 28). FIG. 3A is a block diagram of one embodiment of a circuit 90 to measure output voltage $V_{out}$ of the magnetic tunnel junction 14 of FIG. 2A in accordance with the present invention.

Figure 2B:
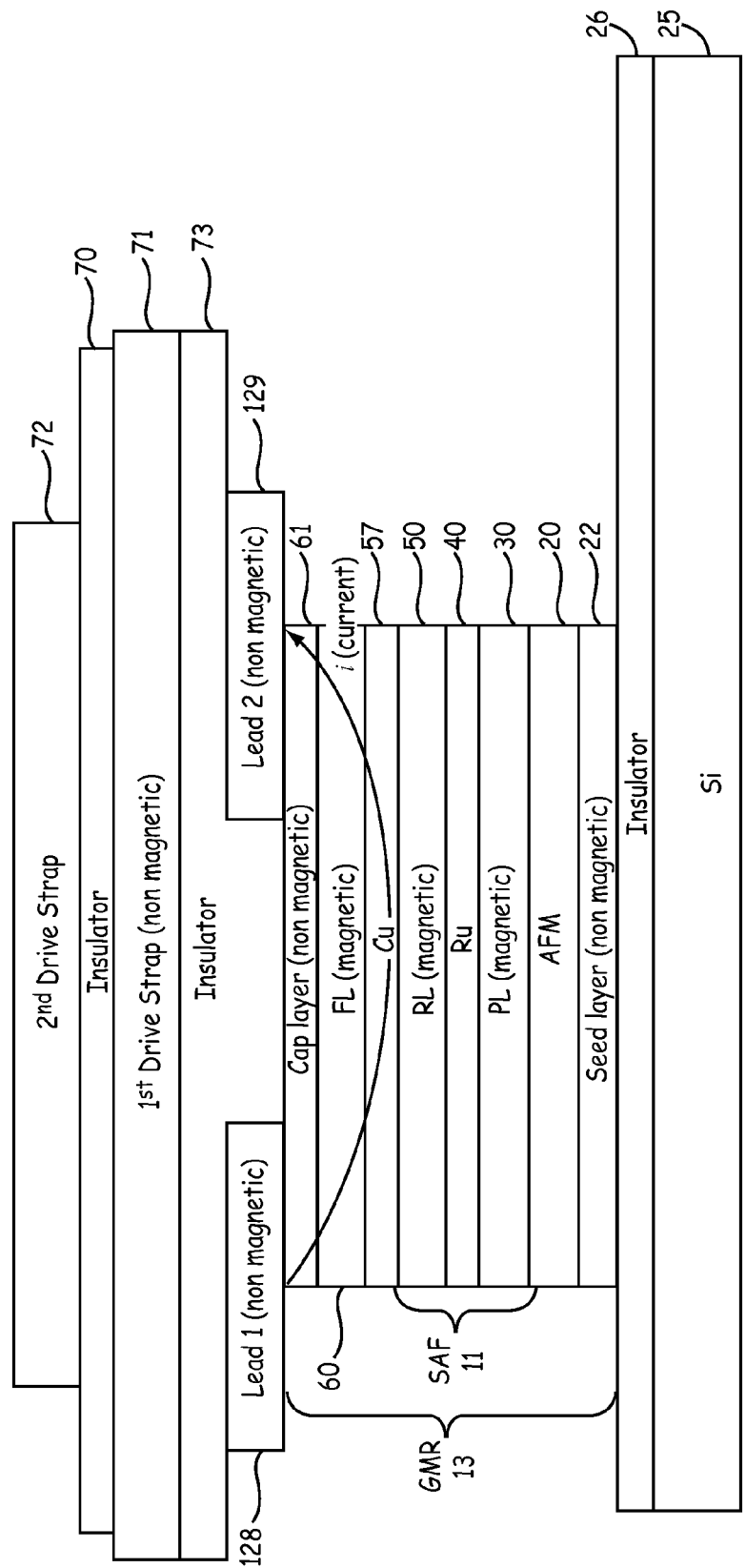
FIG. 2B is a block diagram of one embodiment of a giant magnetoresistor, electrical contacts, a first drive strap, and a second drive strap in accordance with the present invention.

FIG. 2B is a block diagram of one embodiment of a giant magnetoresistor 13, electrical contacts 128 and 129, a first drive strap 71, and a second drive strap 72 in accordance with the present invention. The GMR 13 is a multilayered magnetoresistive sensor 10 as shown in FIG. 1A. The barrier layer 55 shown in FIG. 1A is a non-magnetic conductive layer 57 (such as, a copper (Cu) layer 57) in the giant magnetoresistor 13. The giant magnetoresistor 13 is operable in the current-in-plane (CIP) mode. A seed layer 22 overlaying insulator 26 is used to facilitate growth of the AFM layer 20. A non-magnetic cap layer 61 overlays the free layer 60 of the giant magnetoresistor 13. Two electrical contacts (lead 1 and 2) 128 and 129 overlay opposing edge portions of the cap layer 60. The electrical contacts 128 and 129 are separated from each other by the insulator layer 73. The insulator layer 73 also isolates the electrical contacts 128 and 129 from the first drive strap 71, which is covered by an insulator layer 70. The second drive strap 72 overlays the insulator layer 70.

Figure 3B:
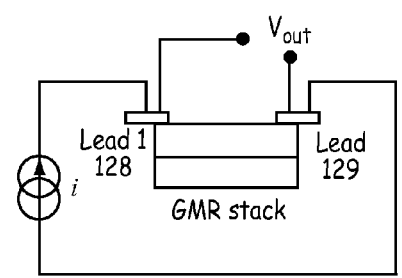
FIG. 3B is a block diagram of one embodiment of a circuit to measure output voltage of the giant magnetoresistor of FIG. 2B in accordance with the present invention.

The electrical contacts 128 and 129 are configured to connect the magnetoresistive sensor 10 to a circuit to measure the magnetoresistance of the giant magnetoresistor 13. As shown in FIG. 2B, the current is directed from lead 1 (electrical contact 128) to lead 2 (electrical contact 129). FIG. 3B is a block diagram of one embodiment of a circuit 91 to measure output voltage $V_{out}$ of the giant magnetoresistor 13 of FIG. 2B in accordance with the present invention. In one implementation of this embodiment, the giant magnetoresistor 13 is configured to operate in current-perpendicular to plane (CPP) mode as is known to one skilled in the art.

Figure 4A:
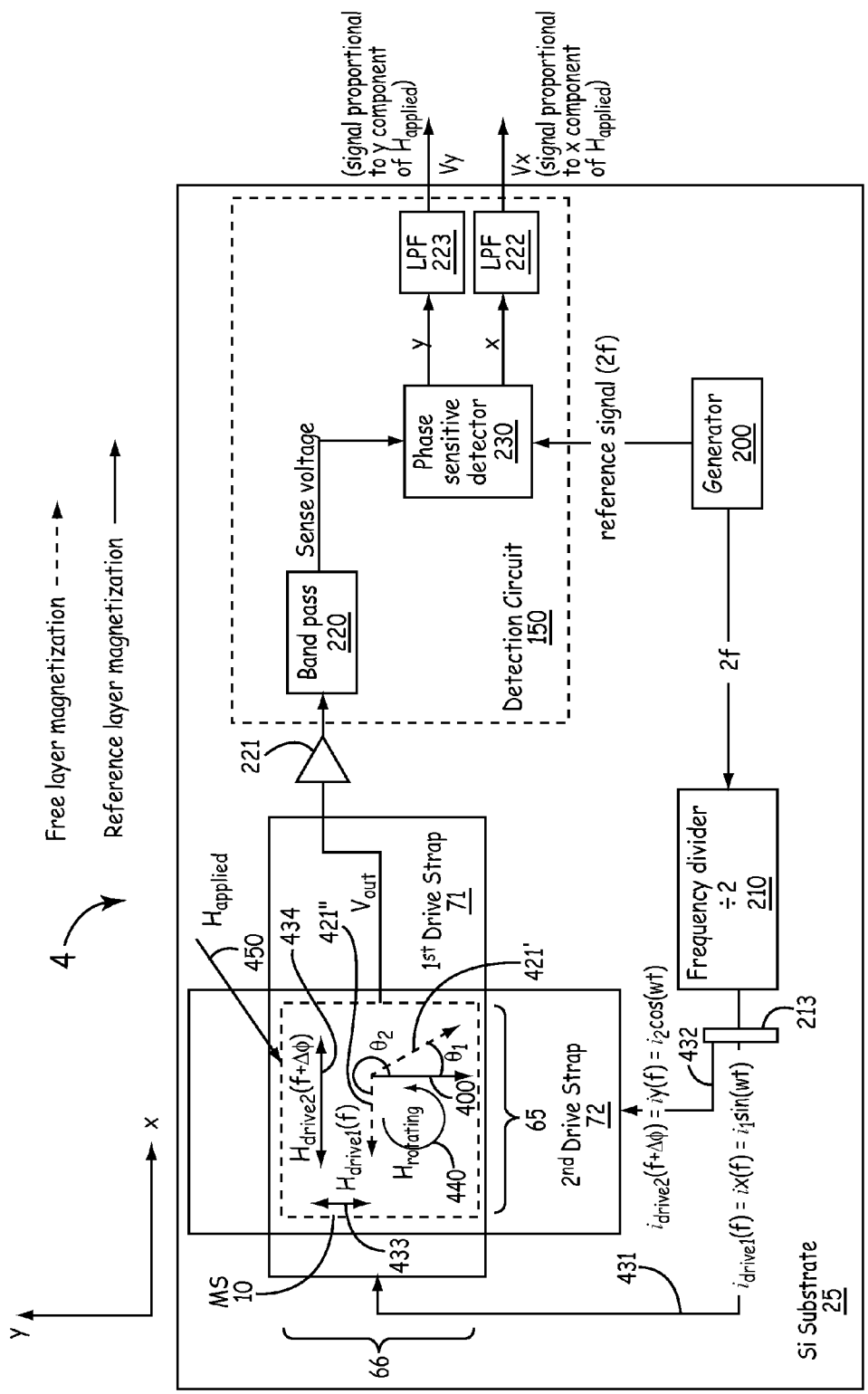
FIGS. 4A and 4B are block diagrams of embodiments of magnetoresistive sensor systems including the magnetoresistive sensor of FIG. 1A in accordance with the present invention.
Figure 4B:
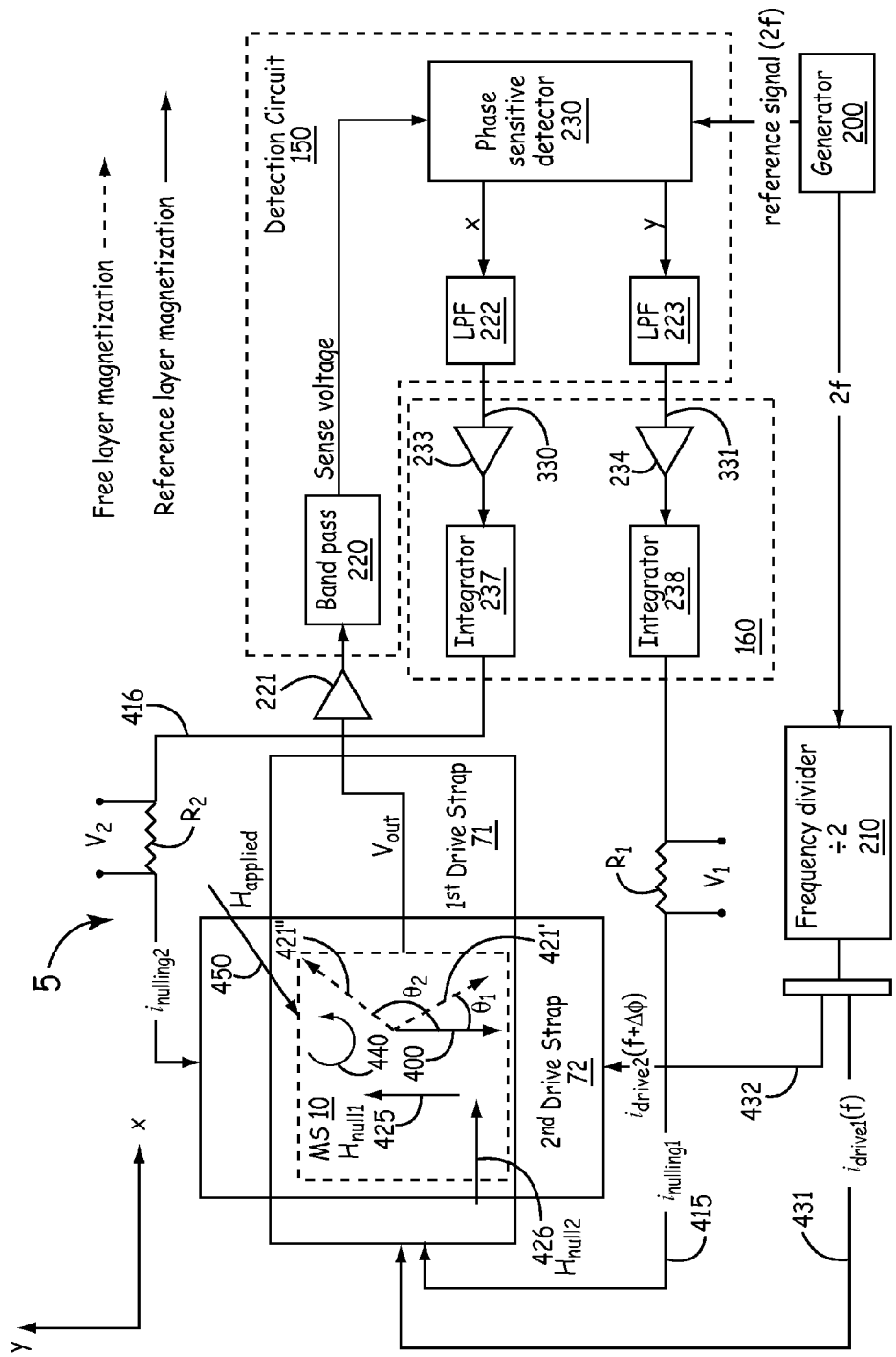

FIGS. 4A and 4B are block diagrams of embodiments of magnetoresistive sensor systems including the magnetoresistive sensor of FIG. 1A in accordance with the present invention. The magnetoresistive sensor system 4 shown in FIG. 4A includes the magnetoresistive sensor 10, an amplifier 221, the first drive strap 71, the second drive strap 72, a detection circuit 150, a frequency generator 200, a frequency divider 210, and a generator 213 to generate two sinusoidal drive currents that are mutually $\pi/2$ radians out of phase. The magnetoresistive sensor 10 is shown as dashed box underlaying the first drive strap 71 and the second drive strap 72. The magnetoresistive sensor 10 is either a magnetic tunnel junction or a giant magnetoresistor.

The detection circuit 150 includes a bandpass filter 220, a phase sensitive detector 230, a first low pass filter (LPF) 222, and a second low pass filter (LPF) 223. The periodic output voltage $V_{out}$ is output from the magnetoresistive sensor 10 via amplifier 221 to the detection circuit 150. The bandpass filter 220 outputs a sense voltage to the phase sensitive detector 230. The phase sensitive detector 230 outputs information indicative of the amplitude and phase of the second harmonic component, or equivalently, X and Y-components of the second harmonic. Thus, the phase sensitive detector 230 has two outputs: an X-output ($V_x$) proportional to the X-component of the second harmonic; and a Y-output ($V_y$) proportional to the Y-component of the second harmonic. The X-output is passed through low pass filter (LPF) 222 to produce a DC signal proportional to the X-component of applied field $H_{applied}$. The Y-output is passed through low pass filter (LPF) 223 to produce a DC signal proportional to the Y-component of applied field $H_{applied}$.

As shown in FIG. 1A, the magnetoresistive sensor 10 includes a ferromagnetic free layer 60 having a rotatable magnetization orientation, a ferromagnetic reference layer 50 having a pinned magnetization orientation (reference layer magnetization 400), and a barrier layer 55 there between. The first drive strap 71 overlaying the magnetoresistive sensor 10 is operably configured to carry an alternating drive current $i_{drive1}(f)$, which alternates with a frequency f. The second drive strap 72 overlaying the magnetoresistive sensor 10 and orthogonally overlaying the first drive strap 71 is operably configured to carry an alternating drive current $i_{drive2}(f+\Delta\phi)$, which alternates with a frequency f.

As shown in FIG. 4A, the frequency generator 200 generates a reference signal alternating at frequency 2f and outputs the signal to the frequency divider 210. The frequency generator 200 also outputs the signal alternating at frequency 2f to the phase sensitive detector 230. The frequency divider 210 divides the signal alternating at frequency 2f in half.

The generator 213 at the output of the frequency divider 210 provides the two drive currents to respective drive straps 71 and 72 that are $\pi/2$ radians out of phase with respect to each other. Specifically, generator 213 outputs the first alternating drive current $i_{drive1}(f)$ at the frequency f to the first drive strap 71 and a second drive current $i_{drive2}(f)$ to the second drive strap 72 that is $\pi/2$ radians out of phase with respect to $i_{drive1}(f)$. There are other techniques that can be used to apply mutually orthogonal alternating drive currents at the frequency f to the first drive strap 71 and the second drive strap 72, as is understandable to one skilled in the art. In one implementation of this embodiment, non-orthogonal and non-parallel first and second straps overlay the magnetoresistive sensor. In this case, the first alternating drive current and the second alternating drive current applied to the respective first and second straps are driven with appropriately phase separated periodic drive signals as is understandable to one skilled in the art upon reading and understanding this document.

In one implementation of this embodiment, the generator 213 simultaneously supplies the signal $i_x(f)=i_1 \sin(\omega t)$ as the first alternating drive current to the first drive strap 71 and the signal $i_y(f)=i_2 \cos(\omega t)$ as the second alternating drive current to the second drive strap 72. In some embodiments, $i_1=i_2$. The leads to connect the magnetoresistive sensor 10 to a circuit (such as circuit 90 or 91 as shown in FIGS. 3A and 3B, respectively) are not shown in FIG. 4A for ease of viewing the fields in the magnetoresistive sensor 10.

The first drive current $i_{drive1}(f)$, which is shown in FIG. 1A as the double arrow labeled 431 in the first drive strap 71, generates a first magnetic drive field $H_{drive1}(f)$, which is shown in FIG. 1A as the circular-double arrow labeled 433. The second drive current $i_{drive2}(f+\Delta\phi)$, which is shown in FIG. 1A as the double arrow labeled 432 in the second drive strap 72, generates a second magnetic drive field $H_{drive2}(f+\Delta\phi)$, which is shown in FIG. 1A as the circular-double arrow labeled 434. The first magnetic drive field $H_{drive1}(f)$ 433 and the second magnetic drive field $H_{drive2}(f+\Delta\phi)$ 434 both extend into the free layer 60 and are superimposed on each other to form a periodically rotating drive field $H_{rotating}$, which is rotating in the X-Y plane as shown by the circular arrow labeled 440 in FIGS. 1A and 4A. The "periodically rotating drive field 440" is also referred to herein as a "periodically rotating magnetic drive field 440".

As shown in FIGS. 1A, 4A, and 4B, the periodically rotating drive field $H_{rotating}$ 440 rotates counter-clockwise (CCW) as viewed in the negative Z direction, the free layer magnetization is periodically rotated to be parallel to the rotating magnetic field in the free layer 60. In one implementation of this embodiment, the phase delay $\Delta\phi$ is added to the current applied to the first drive strap 71 instead of the second drive strap 72. In this case, the periodically rotating drive field $H_{rotating}$ 440 rotates clockwise (CW) as viewed in the negative Z direction.

The periodically rotating drive field $H_{rotating}$ 440 shifts the operating point of the magnetoresistive sensor 10 beyond the knee of the 1/f noise power spectral density curve to take advantage of the high $\Delta R/R$ of the MTJ or GMR. Thus, the periodically rotating drive field $H_{rotating}$ 440 advantageously permits the magnetoresistive sensor system 4 to achieve high signal-to-noise ratio, or conversely, to lower the minimum detectable field (mdf). As defined herein, the operating point of the magnetoresistive sensor is that point on the noise versus frequency function of the magnetoresistive sensor 10 at which the magnetoresistive sensor 10 is driven to operate by the periodically rotating drive field $H_{rotating}$ 440.

The magnetoresistive sensor 10 (a magnetic tunnel junction 14 or a giant magnetoresistor 13) provides a transfer function between free layer's magnetic induction and resistance, so that voltage measurements can be made in the detection circuit 150.

Specifically, within a range of the first drive current $i_{drive1}$ (f) 431 and the second drive current $i_{drive2}(f+\Delta\phi)$ 432 (with amplitude that is sufficiently high to saturate the free layer 60, but low enough that the reference layer 50 is substantially unaffected) the free layer magnetization 421 periodically rotates through 360 degrees ($2\pi$ radians) to create a periodic resistance change in the magnetoresistive sensor 10. As shown in the top view of the magnetic sensor 10 in FIG. 4A, the free layer magnetization 421' at a first time $t_1$ is at the angle $\theta_1$ from the reference layer magnetization 400 and at a time $t_2$, the free layer magnetization 421" is at the angle $\theta_2$ from the reference layer magnetization 400. When only a periodic drive current is applied to the magnetoresistive sensor 10, and no DC (or low frequency) magnetic field $H_{applied}$ 450 is present, the ideal output of the magnetoresistive sensor 10 includes only odd harmonic multiples of frequency f.

In general, the dynamics of magnetization of the free layer 60 (the free layer magnetization 421) depends on the size, aspect ratio, and other material properties (grain size, defect density, $4\pi M_s$) of the free layer 60 and the magnetoresistive sensor 10. For larger magnetoresistive sensors 10 (dimensions $>\sim 1$ μm) the dynamics of magnetization during switching from one state of saturation to the opposite state of saturation involves domain wall dynamics. Domain wall mediated switching generally involves Barkhausen jumps that are the source of Barkhausen noise. For magnetoresistive sensors 10 that have dimensions smaller than $\sim 1$ μm, the free layer 60 generally switches from one state of saturation to the opposite state of saturation by nucleation and the propagation of magnetic vortices. The size dependence described above is not exact and the transition from domain wall mediated dynamics to vortex mediated dynamics is also a function of other material parameters of the ferromagnetic material comprising the sensor. These dynamics also apply to any large changes in the state of magnetization and are not limited to switching from one state of saturation to another state of saturation.

When the magnetization of free layer 60 is coherently rotated by the periodically rotating magnetic drive field H$_{rotating}$ 440, Barkhausen noise is reduced. Thus, coherent rotation of the free layer magnetization 421 is ensured by maintaining the periodically rotating magnetic drive field H$_{rotating}$ 440. The magnitude of the periodically rotating magnetic drive field H$_{rotating}$ 440 is determined empirically by examining the quality of the output waveform of the magnetoresistive sensor 10. Since the magnetoresistive sensors 10 have small dimensions, the first drive strap 71 and the second drive strap 72 are operable to produce the periodically rotating magnetic drive field H$_{rotating}$ 440 at modest values of current and power.

When an external magnetic field to be measured H$_{applied}$ 450 is applied to the magnetoresistive sensor 10, the magnetic field to be measured H$_{applied}$ 450 is superimposed on the periodically rotating magnetic drive field H$_{rotating}$ 440 in the X-Y plane of the magnetoresistive sensor 10. In this case, the magnetic field in the free layer 60 equals the superposition of the periodically rotating drive field H$_{rotating}$ 440 and the externally applied magnetic field 450. The output of magnetoresistive sensor 10 resultant from this superposition includes even harmonic components. The lowest order even harmonic is the second harmonic component at frequency 2f.

The detection circuit 150 extracts the second harmonic component of the output voltage V$_{out}$ of the magnetoresistive sensor 10. The magnitude of the magnetic field to be measured H$_{applied}$ 450 in the X-Y plane (|H$_{applied}$| in the exemplary case shown in FIG. 1B) is proportional to an amplitude of the extracted second harmonic component of the output voltage V$_{out}$. The orientation (angle φ in the exemplary case shown in FIG. 1B) of the magnetic field to be measured H$_{applied}$ 450 in the X-Y plane is simply related to a phase angle of the extracted second harmonic component of the output voltage V$_{out}$.

This mathematical relationship between the applied field H$_{applied}$ 450 and the amplitude and the phase angle of the second harmonic is now derived. Initially assume that the external field h is zero (e.g., h=H$_{applied}$=0). A rotating drive field H$_D$ (e.g., H$_D$=H$_{rotating}$) is applied at a frequency f in the plane of the sensor. The amplitude of the drive field is such that it does not affect the reference layer. It is also assumed that that anisotropy of the free layer 60 is sufficiently small and the drive field H$_D$ sufficiently large that the drive field H$_D$ saturates the free layer magnetization (shown as 421' and 421" in FIGS. 4A and 4B), i.e., the free layer magnetization always points in the instantaneous direction of the rotating drive field H$_D$.

The drive field is given by H$_D$=H$_0$ exp(iωt), where ω=2πf. With the assumption of saturation described above, the magnetoresistance (MR) is also sinusoidal at the frequency f. Next, in the presence of a sinusoidal drive field and an external field h, the free layer magnetization now points in the direction of the total field vector H$_D$(ω)+h. A unit vector in the direction of free layer magnetization, using the complex number notation, is given by $$k_M = \frac{H_D(\omega)+h}{|H_D(\omega)+h|} = \frac{H_0 e^{i\omega t}+h e^{i\phi}}{\sqrt{H_0^2+h^2+2H_0 h\cos(\omega t-\phi)}}$$

The unit vector k$_R$ parallel to reference layer magnetization is given by $$k_R = e^{i\phi_R}.$$

The unit vector parallel to the free layer magnetization is k$_M$. The angle between the free layer magnetization (i.e., instantaneous free layer magnetization 421' or 421") and reference layer magnetization (i.e., reference layer magnetization 400) is given by $$\cos\theta = Re(k_M k_R^*),$$

where k$_R$* is the complex conjugate of k$_R$. The time dependence of magnetoresistance is given by the time dependence of cos θ.

$$MR = -\frac{1}{2}\left(\frac{\Delta R}{R}\right)\left(\frac{\cos(\omega t-\phi_R)+u\cos(\phi-\phi_R)}{\sqrt{1+2u\cos(\omega t-\phi)+u^2}}\right),$$

where u=h/H$_0$. Expanding the above expression in linear power of u, one obtains, $$MR = -\frac{1}{2}\left(\frac{\Delta R}{R}\right)\left(\cos(\omega t-\phi_R)-\frac{u}{2}\cos(2\omega t-(\phi+\phi_R))\right).$$

Within the linear approximation in powers of (h/H$_0$), the amplitude of the second harmonic is proportional to the applied field h, and the phase of the second harmonic equals (φ+φ$_R$). Since the reference layer phase angle φR is known, one can deduce the phase angle of the applied field. Thus, in the proposed mode of operation, the second harmonic component provides both the amplitude and direction of the applied field.

This analysis ignored the effects of free layer anisotropy H$_k$. With a nonzero anisotropy of the free layer, the magnetization direction will not point parallel to the instantaneous direction of the field. However, for sufficiently large amplitude of the drive field (H$_0$>>H$_k$), it is expected that the anisotropy adds a correction term to the formula derived above. The overall scheme described herein still works.

This amplitude and phase can be converted into orthogonal components (e.g., X-component and Y-component) as is known to one skilled in the art. For a range of values of H$_{applied}$, such that H$_{applied}$<H$_0$, where H$_0$ is the amplitude of the periodic drive field, the amplitude of the output voltage V$_{out}$ is proportional to H$_{applied}$.

When a periodically rotating drive field H$_{rotating}$ 440 rotating at an angular frequency ω is applied in the plane of the sensor (e.g., the X-Y plane), the free layer magnetization points in the instantaneous direction of the periodically rotating drive field H$_{rotating}$ 440. The instantaneous direction of the periodically rotating drive field H$_{rotating}$ 440 does not affect the reference layer 50. Since the anisotropy of the free layer 60 is sufficiently small and the drive field sufficiently large (i.e., H$_0$>>H$_k$), the drive field saturates the free layer magnetization.

By driving the magnetoresistive sensor 10 at a frequency f that is past the knee of the 1/f noise curve, the signal-to-noise ratio of the magnetoresistive sensor 10 is higher than the signal-to-noise ratio of the magnetoresistive sensor in operation near zero frequency. The periodically rotating drive field H$_{rotating}$ 440 at an angular frequency ω=2πf is set so that f=ω/2π is greater than the knee of the 1/f noise curve.

The frequency generator 200 outputs a spectrally pure driving waveform without any second harmonic components. If there are even harmonic components present in the first drive current i$_{drive1}$(f) and/or the second the drive current i$_{drive2}$(f+Δφ) 432, the output V$_{out}$ will have even harmonic components even in the absence of an applied field (i.e., a null offset). If a spectrally pure driving waveform is not produced by the frequency generator 200, the null offset at the output of the detection circuitry can be calibrated out by the user.

The magnetoresistive sensor system 5 shown in FIG. 4B includes the components of the magnetoresistive sensor system 4 of FIG. 4A as well as a feedback circuit 160. In this magnetoresistive sensor system 5, the first drive strap 71 and the second drive strap 721 are used to operate the magnetoresistive sensor 10 in a closed loop mode.

The feedback circuit 160 includes an X-component amplifier 233, an X-component integrator 237, a Y-component amplifier 234, and a Y-component integrator 238. The X-output ($V_x$) proportional to the X-component of the amplitude of the second harmonic that is output as signal 330 from the low pass filter 222. The signal 330 is input to the X-component amplifier 233. The output from the X-component amplifier 233 is input to the integrator 237. Simultaneously, the Y-output ($V_y$) proportional to the Y-component of the second harmonic is output as signal 331 from the low pass filter 223. The signal 331 is input to the Y-component amplifier 234. The output from the Y-component amplifier 234 is input to the integrator 238. Signal 330 is proportional to the X-component of $H_{applied}$ 450 and signal 331 is proportional to Y-component of $H_{applied}$ 450.

The feedback circuit 160 takes input signals 330 and 331 from the detection circuit 150 and outputs the first nulling current $I_{nulling1}$ 415 to the first drive strap 71 and outputs the second nulling current $I_{nulling2}$ 416 to the second drive strap 72. The first drive strap 71 and second drive strap 72 are both overlaying the magnetoresistive sensor 10 in order to generate a first nulling magnetic field $H_{null1}$ 425 and a second nulling magnetic field $H_{null2}$ 426 opposing the Y and X-components, respectively, of the magnetic field being detected ($H_{applied}$) 450.

The first nulling current $I_{nulling}$ 415 can be measured by measuring the voltage drop $V_1$ across a first stable series resistor $R_1$. The first nulling current 415 or the corresponding voltage drop $V_1$ across the series resistor $R_1$ is proportional to the Y-component of the applied magnetic field $H_{applied}$ 450. The resistor $R_1$ is a fixed, temperature stable resistor.

The second nulling current $I_{nulling2}$ 416 can be measured by measuring the voltage drop $V_2$ across a second stable series resistor $R_2$. The second nulling current $I_{nulling2}$ 416 or the corresponding voltage drop $V_2$ across the series resistor $R_2$ is proportional to the X-component of the applied magnetic field $H_{applied}$ 450. The resistor $R_2$ is a fixed, temperature stable resistor.

Thus, the X and Y-components of the second harmonic signal 330 and 331, respectively, are amplified, integrated, and used as feedback current (i.e., second nulling current $I_{nulling2}$ 416 and first nulling current $I_{nulling}$ 415) to buck the X and Y-components of the external applied magnetic field $H_{applied}$ 450. It is assumed that the time scales of the applied magnetic field $H_{applied}$ 450 and that of periodically rotating drive field $H_{rotating}$ 440 are well separated, i.e., applied magnetic field $H_{applied}$ 450 is of low frequency or near DC.

In this manner, the only excursions of magnetization of the free layer 60 are those caused by periodically rotating magnetic drive field $H_{drive}(f)$ 440. There is no DC shift in the magnetization states of the free layer 60 as the magnetoresistive sensor 10 senses a range of applied fields, since any applied magnetic field $H_{applied}$ 450 in the X-Y plane is nulled by the superposition of the first nulling magnetic field $H_{null1}$ 425 and the second nulling magnetic field $H_{null2}$ 426. This feedback reduces Barkhausen noise so that the signal-to-noise ratio of the magnetoresistive sensor 10 is further improved, and also increases the field dynamic range of the magnetoresistive sensor 10.

As shown in FIGS. 4A and 4B, the magnetoresistive sensor 10 has a rectangular profile in the X-Y plane. In another implementation of this embodiment, the magnetoresistive sensor has a circular profile in the X-Y plane.

Figure 5A:
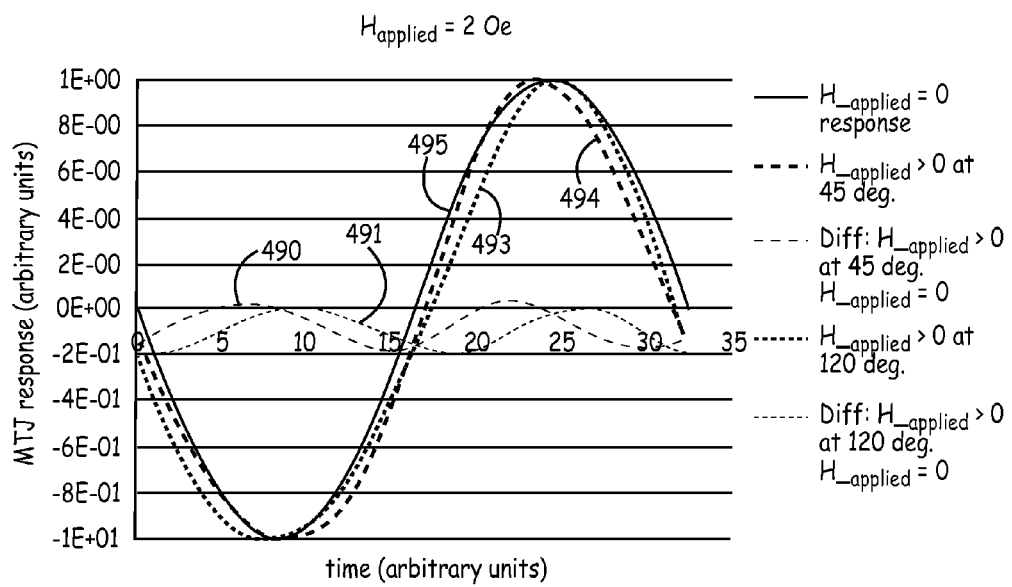
FIGS. 5A and 5B show simulated output for different applied magnetic fields applied to an exemplary magnetoresistive sensor in accordance with the present invention.
Figure 5B:
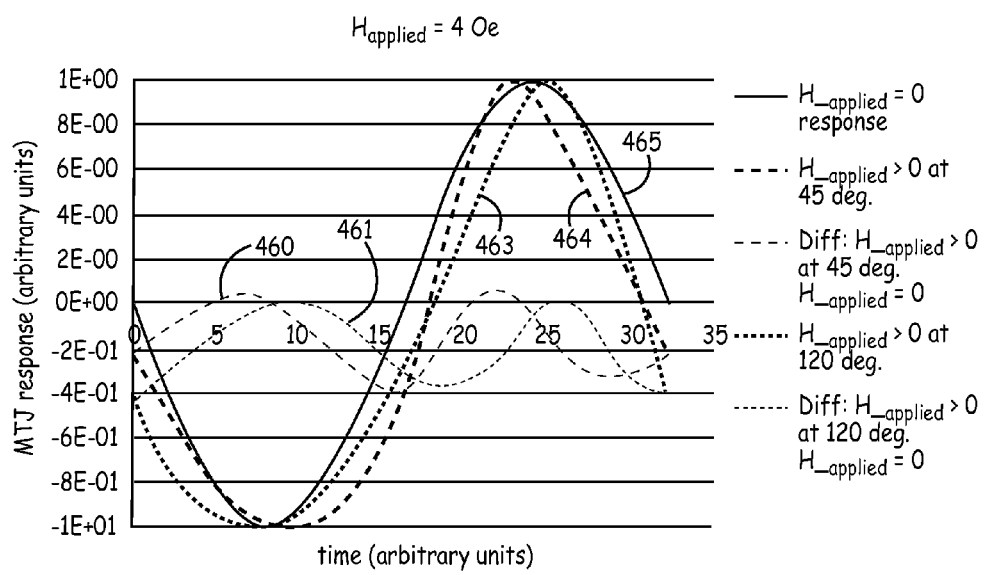

FIGS. 5A and 5B show simulated output for different applied magnetic fields applied to an exemplary magnetoresistive sensor in accordance with the present invention. A rotating drive field $H_0=10$ Oe at a period of 32 time units in the plots of FIGS. 5A and 5B is implicit and is not shown.

FIG. 5A shows the simulated output for $H_{applied}$ equal to 2 Oe. The waveform 495 is a plot of $V_{out}$ when $H_{applied}=0$ Oe. The waveform 494 is a plot of $V_{out}$ when $H_{applied}=2$ Oe with a phase angle $\phi=45$ degrees (FIG. 1B). The waveform 493 is a plot of $V_{out}$ when $H_{applied}=2$ Oe with a phase angle $\phi=120$ degrees (FIG. 1B). The difference waveform 490 plots the difference between waveform 494 and waveform 495. The difference waveform 491 plots the difference between waveform 493 and waveform 495. The difference waveforms 490 and 491 contain only even harmonics, the leading Fourier component being the second harmonic.

FIG. 5B shows the simulated output for $H_{applied}$ equal to 4 Oe. The waveform 465 is a plot of $V_{out}$ when $H_{applied}=0$ Oe. The waveform 464 is a plot of $V_{out}$ when $H_{applied}=4$ Oe with a phase angle $\phi=45$ degrees (FIG. 1B). The waveform 463 is a plot of $V_{out}$ when $H_{applied}=4$ Oe with a phase angle $\phi=120$ degrees (FIG. 1B). The difference waveform 460 plots the difference between waveform 464 and waveform 465. The difference waveform 461 plots the difference between waveform 463 and waveform 465. The difference waveforms 460 and 461 contain only even harmonics, the leading Fourier component being the second harmonic. Thus, FIGS. 5A and 5B clearly show how the output difference waveform changes based on the amplitude and phase angle of $H_{applied}$.

Figure 6:
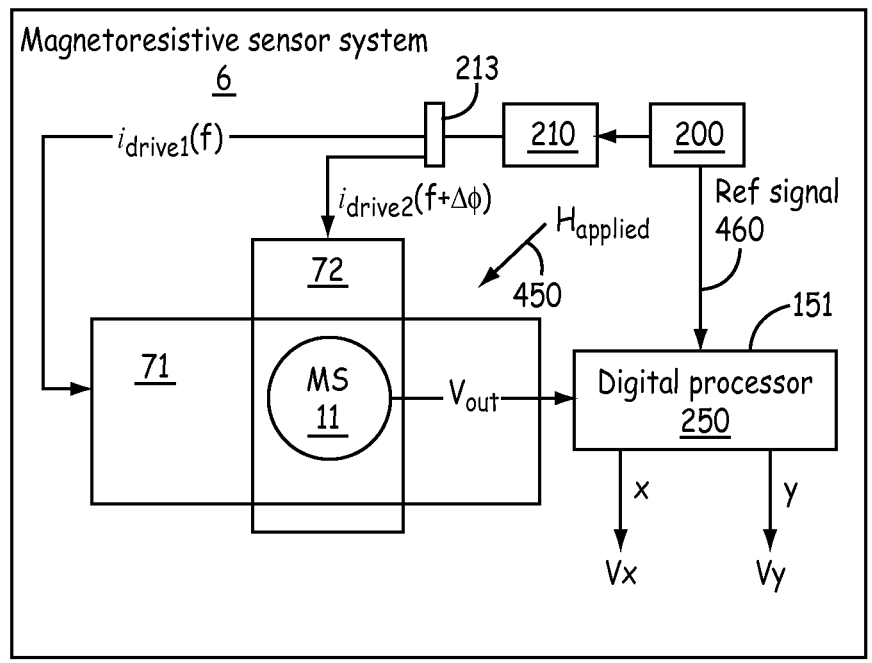
FIG. 6 is block diagram of an embodiment of a magnetoresistive sensor system including a magnetoresistive sensor in accordance with the present invention.

FIG. 6 is block diagram of an embodiment of a magnetoresistive sensor system 6 including a magnetoresistive sensor 11 in accordance with the present invention. As shown in FIG. 6, the magnetoresistive sensor 11 has a circular profile in the X-Y plane. In another implementation of this embodiment, the magnetoresistive sensor is rectangular in shape. The function of the magnetoresistive sensor system 6 is the same as the function of the magnetoresistive sensor systems 4 and 5 described above with reference to FIGS. 4A and 4B. The magnetoresistive sensor system 6 includes a magnetoresistive sensor 11, a first drive strap 71, second drive strap 72, which overlays the first drive strap 71 and the magnetoresistive sensor 11. The magnetoresistive sensor system 6 also includes a frequency generator 200, and a detection circuit 151. The structure of the magnetoresistive sensor system 6 differs from the magnetoresistive sensor systems 4 and 5 of FIGS. 4A and 4B in that the detection circuit 151 includes a digital processor 250 rather than the band pass filter 220, the phase sensitive detector 230 and the low pass filter 222 of the detection circuit 150.

The digital processor 250 receives an output voltage $V_{out}$ from the magnetoresistive sensor 11, extracts a second harmonic component of the output voltage $V_{out}$ and outputs two signals: an X-output ($V_x$) proportional to the X-component of the amplitude of the second harmonic; and a Y-output ($V_y$) proportional to the Y-component of the second harmonic. Thus, the function of the digital processor 250 is the same as the function of the detection circuit 150 (FIGS. 4A and 4B).

Figure 7:
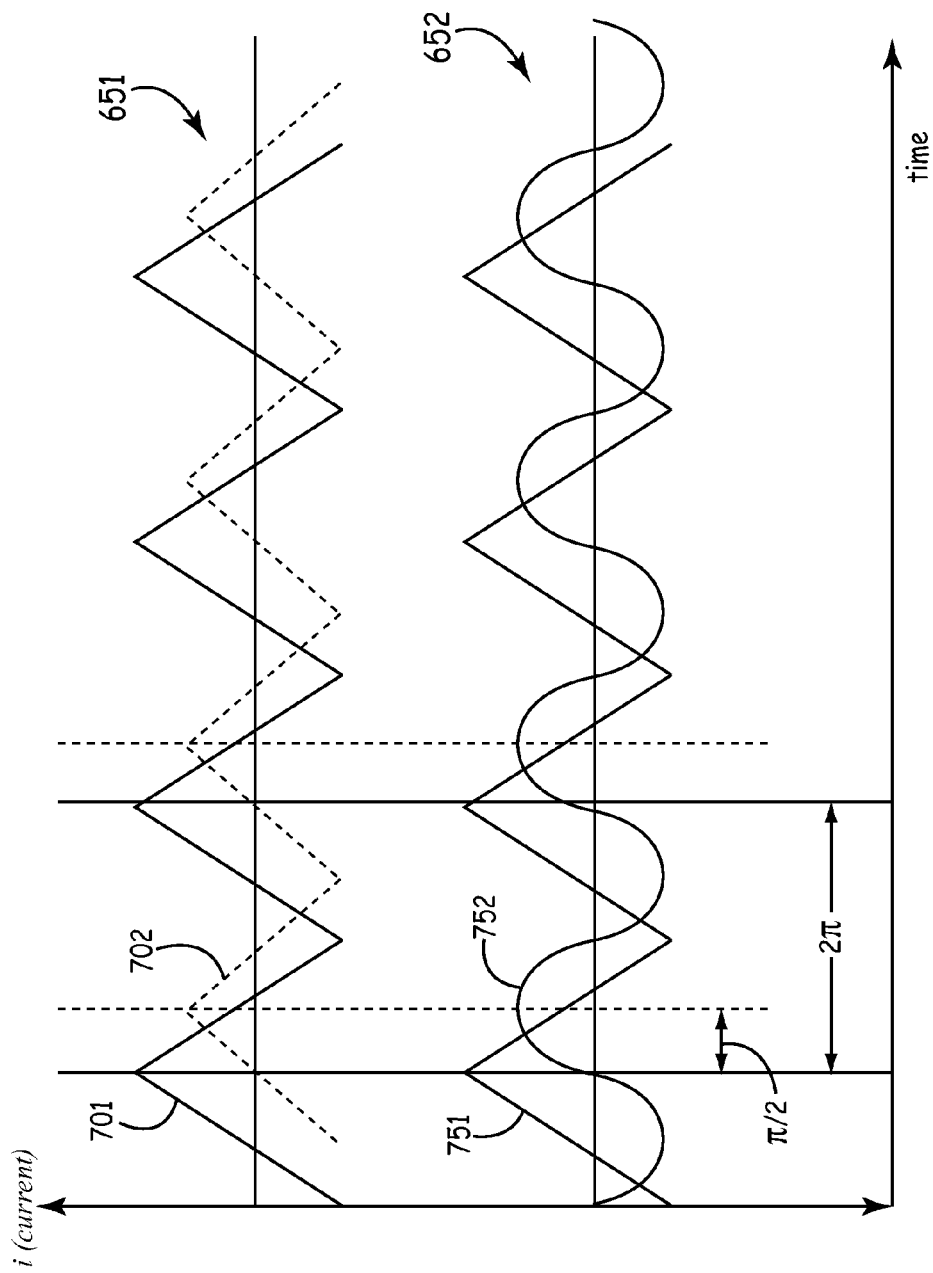
FIG. 7 shows embodiments of tailored shapes of drive currents.

FIG. 7 shows embodiments of tailored shapes of drive currents. By tailoring the shapes of the first and second alternating drive currents applied to the first and second drive straps 71 and 72, respectively, the amplitude of the extracted second harmonic component is increased as is known to one skilled in the art.

Two exemplary sets 651 and 652 of first and second alternating drive currents are shown in FIG. 7. For ease of viewing, the first set 651 of alternating drive currents 701 and 702 is offset from the second set 652 of alternating drive currents 751 and 752.

The first set 651 of first and second alternating drive currents includes a first alternating drive current 701, which has a first saw-tooth shape over time and a second alternating drive current 702, which has a second saw-tooth shape over time. The first alternating drive current 701 is shown superimposed on the second alternating drive current 702. The $\pi/2$ (90 degree) phase shift is indicated between the peak of first alternating drive current 701 and the peak of the second alternating drive current 702. The exemplary first alternating drive current 701 is applied to the first strap 71. The exemplary second alternating drive current 702 is applied to the second strap 71.

The second set 652 of first and second alternating drive currents includes a first alternating drive current 751, which has a first saw-tooth shape over time and a second alternating drive current 752, which has a sinusoidal shape over time. The first alternating drive current 751 is shown superimposed on the second alternating drive current 752. The $\pi/2$ (90 degree) phase shift is indicated between the peak of first alternating drive current 751 and the peak of the second alternating drive current 752. The exemplary first alternating drive current 751 is applied to the first strap 71. The exemplary second alternating drive current 752 is applied to the second strap 71. As is understood, these are exemplary shapes and other shapes of the current versus time can be used.

Figure 8:
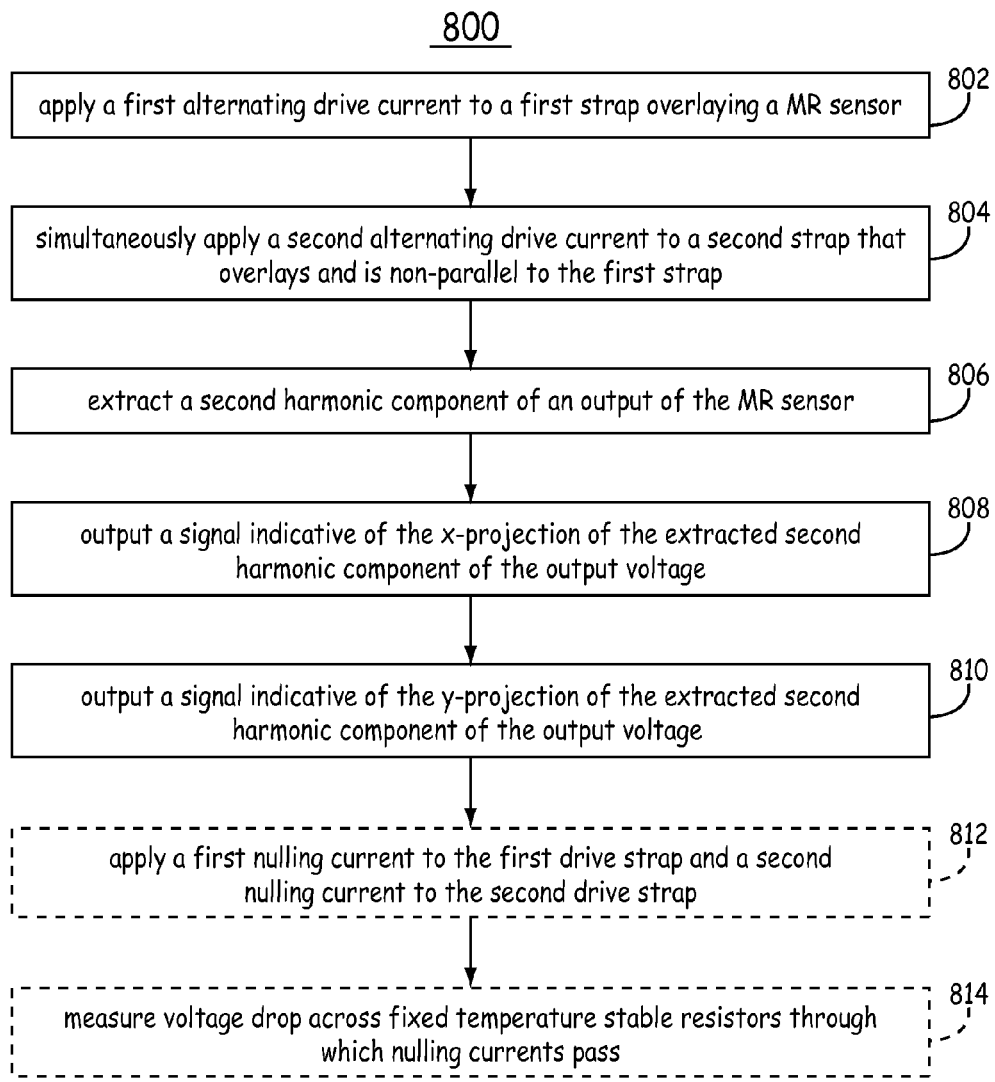
FIG. 8 is a flow diagram of one embodiment of a method to measure an applied magnetic field in a plane in accordance with the present invention.

FIG. 8 is a flow diagram of one embodiment of a method 800 to measure an applied magnetic field $H_{applied}$ in a plane in accordance with the present invention. The method 800 is applicable to the embodiments of magnetoresistive sensor systems 4, 5, and 6 described above with reference to FIGS. 4A, 4B, and 6, respectively.

At block 802, a first alternating drive current $i_{drive1}(f)$ 431 is applied to a first strap 71 overlaying a magnetoresistive sensor (MS) 10. A first alternating magnetic drive field $H_{drive1}(f)$ 433 is generated in the magnetoresistive sensor 10 by the alternating drive current $i_{drive1}(f)$. As shown in FIG. 4A, the first alternating magnetic drive field $H_{drive1}(f)$ 433 oscillates parallel to the Y axis, which lies in the X-Y plane of the magnetoresistive sensor (MS).

The first alternating drive current $i_{drive1}(f)$ 431 shifts the operating point of the magnetoresistive sensor 10 to a low noise region. The low noise region is above the knee in the 1/f noise spectrum. In one implementation of this embodiment, the first alternating drive current $i_{drive1}(f)$ 431 is applied to a first drive strap 71 overlaying a magnetic tunnel junction 14 (FIG. 2A) to shift the operating point of the magnetic tunnel junction 14 to the low noise region. In another implementation of this embodiment, the first alternating drive current $i_{drive1}(f)$ 431 is applied to the first drive strap 71 overlaying a giant magnetoresistor 13 (FIG. 2B) to shift the operating point of the giant magnetoresistor 13 to the low noise region.

In one implementation of this embodiment, the alternating drive current $i_{drive1}(f)$ 431 is applied to a first drive strap 71 as follows: a signal at an initial frequency $2f$ is output from a frequency generator 200 to a frequency divider 210; the signal at the initial frequency $2f$ is frequency divided in half to generate the signal at a drive frequency f; and the signal at the drive frequency f is, in turn, used to generate an input to the first drive strap 71 at a generator 213. The first alternating drive current $i_{drive1}(f)$ 431 is alternating at the drive frequency f. The drive frequency f is half of the initial frequency $2f$.

At block 804, a second alternating drive current $i_{drive2}(f+\Delta\phi)$ 432 is applied to a second drive strap 72 overlaying a magnetoresistive sensor (MS) 10 simultaneously with the first alternating drive current $i_{drive1}(f)$ being applied to a first drive strap 71. The second drive strap 72 is orientated at an angle (i.e., non-parallel) with the first drive strap 71. In one implementation of this embodiment, the second drive strap 72 is orientated perpendicular to the first drive strap 71. Specifically, the first drive strap 71 has a dimension extending in a first direction and the second drive strap 72 has a dimension extending in a second direction, the second direction being perpendicular to the first direction. The first alternating drive current $i_{drive1}(f)$ 431 is applied to flow in the first direction, while the second alternating drive current $i_{drive2}(f+\Delta\phi)$ 432 is simultaneously applied to flow in the second direction.

A second alternating magnetic drive field $H_{drive2}(f+\Delta\phi)$ is generated in the magnetoresistive sensor 10 by the alternating drive current $i_{drive2}(f+\Delta\phi)$ 432.

If the second drive strap 72 is orientated at some angle other than 0 degrees and 90 degrees to the first drive strap 71, then $\Delta\phi$ is set as appropriate to generate to a periodically rotating magnetic drive field rotating in the plane in the magnetoresistive sensor 10 or 11. If the second drive strap 72 is orientated perpendicular to the first drive strap 71, $\Delta\phi$ is set equal to $\pi/2$ radians. As shown in FIG. 4A, the second alternating magnetic drive field $H_{drive2}(f)$ oscillates parallel to the X axis, which lies in the X-Y plane of the magnetoresistive sensor (MS).

The second alternating drive current $i_{drive2}(f+\Delta\phi)$ 432 shifts the operating point of the magnetoresistive sensor 10 to a low noise region. In one implementation of this embodiment, the second alternating drive current $i_{drive2}(f+\Delta\phi)$ 432 is applied to the second drive strap 72 overlaying a magnetic tunnel junction 14 (FIG. 2A) to shift the operating point of the magnetic tunnel junction 14 to the low noise region. In another implementation of this embodiment, the second alternating drive current $i_{drive2}(f+\Delta\phi)$ 432 is applied to the second drive strap 72 overlaying a giant magnetoresistor 13 (FIG. 2B) to shift the operating point of the giant magnetoresistor 13 to the low noise region.

The second alternating drive current $i_{drive2}(f+\Delta\phi)$ 432 is applied to a second drive strap 72 as follows: the signal at an initial frequency $2f$ is output from a frequency generator 200 to a frequency divider 210; the signal at the initial frequency $2f$ is frequency divided in half to generate the signal at a drive frequency f; and the signal at the drive frequency f is, in turn, used to generate an input to the first drive strap 71 at a generator 213. Specifically, the second signal applied to the second drive strap 72 at the drive frequency f is phase delayed (or advanced) by $\Delta\phi$ from the current applied to the first strap 71 at the generator 213. The second alternating drive current $i_{drive2}(f+\Delta\phi)$ 432 is alternating at the drive frequency f.

As is shown in FIG. 1B, the periodically rotating drive field $H_D = H_0 e^{i\omega t}$, numerically labeled as 440, which rotates in the X-Y plane of the magnetoresistive sensor 10, is generated by the superposition of the first alternating magnetic drive field $H_{drive1}(f)$ 433 (FIGS. 1A and 4A) with the second alternating magnetic drive field $H_{drive2}(f+\Delta\phi)$ 434 (FIGS. 1A and 4A). Specifically, the first alternating magnetic drive field $H_{drive1}(f)$ 433 oscillating along the Y axis and the second alternating magnetic drive field $H_{drive2}(f+\Delta\phi)$ 434 simultaneously oscillating along the X axis generates the periodically rotating drive field $H_{rotating}$ 440, which is shown as rotating in counter-clockwise direction around the Z axis.

At block 806, a second harmonic component of an output of the magnetoresistive sensor 10 is extracted from the magnetoresistive (MR) sensor 10. The second harmonic component is only generated when a magnetic field to be measured $H_{applied}$ 450 is superimposed on the periodically rotating magnetic drive field $H_{rotating}$ 440 that is rotating in the X-Y plane of the free layer 60 of the magnetoresistive sensor 10.

In one implementation of this embodiment, the second harmonic component of the output of the magnetoresistive sensor 11 (FIG. 6) is extracted as follows: an output voltage $V_{out}$ is output from the magnetoresistive sensor 11 to a digital processor 250; the output voltage is Fourier decomposed at the digital processor 250; a reference signal 460 at the initial frequency is input to the digital processor 250 from the frequency generator 200; and the second harmonic component of the Fourier decomposed output voltage at the initial frequency (2*f*) is extracted. The magnetoresistive sensor system 6 shown in FIG. 6 is configured to extract the second harmonic component of the output of the magnetoresistive sensor 11 in this manner In another implementation of this embodiment, the second harmonic component of the output of the magnetoresistive sensor 10 is extracted as follows: an output voltage from the magnetoresistive sensor is filtered at a band pass filter 220; an output (sense voltage) of the band pass filter 220 is input to a phase sensitive detector 230; a reference signal at the initial frequency 2*f* is input to the phase sensitive detector 230 from the frequency generator 200; and the second harmonic component of the filtered output voltage is extracted at the phase sensitive detector 230. The magnetoresistive sensor systems 4 and 5 shown in FIGS. 4A and 4B are configured to extract the second harmonic component of the output of the magnetoresistive sensor 10 in this manner.

At block 808, a signal indicative of the X-projection of the extracted second harmonic component of the output voltage $V_{out}$ is output from the detection circuit. The X-component of the magnetic field to be measured $H_{applied}$ 450 in the X-Y plane of the free layer 60 is proportional to the X-projection of the extracted second harmonic component of the output voltage $V_{out}$.

In one implementation of this embodiment, X-projection of the extracted second harmonic component of the output voltage $V_{out}$ is output from the phase sensitive detector 230 as shown in FIGS. 4A and 4B. In another implementation of this embodiment, the X-projection of the extracted second harmonic component of the output voltage $V_{out}$ is output from the digital processor 250 as shown in FIG. 6.

At block 810, a signal indicative of Y-projection of the extracted second harmonic component of the output voltage $V_{out}$ is output from the detection circuit. The Y-component of the magnetic field to be measured $H_{applied}$ 450 in the X-Y plane of the free layer 60 is proportional to the Y-projection of the extracted second harmonic component of the output voltage $V_{out}$.

In one implementation of this embodiment, a Y-projection of the extracted second harmonic component of the output voltage $V_{out}$ is output from the phase sensitive detector 230 as shown in FIGS. 4A and 4B. In one implementation of this embodiment, the signal indicative of the Y-projection of the extracted second harmonic component of the output voltage $V_{out}$ is output from the digital processor 250 as shown in FIG. 6.

It is to be understood that the signal output from the detection circuit 150 during blocks 808 and 810 can be: a first signal that includes the information indicative of the projection of the extracted second harmonic component for a first direction of the plane; and a second signal that includes the information indicative of the projection of the extracted second harmonic component for a second direction of the plane, where the second direction is orthogonal to the first direction, and wherein the phase angle information was used to provide the correct projection in each direction.

Block 812 is optional. At block 812, a first nulling current $I_{nulling1}$ 415 is applied to the first drive strap 71 to generate a first nulling magnetic field $H_{null1}$ 425 in the magnetoresistive sensor 10 and a second nulling current $I_{nulling2}$ 416 is applied to the second drive strap 72 to generate a second nulling magnetic field $H_{null2}$ 426 in the magnetoresistive sensor 10 (see FIG. 4B). The first nulling magnetic field $H_{null1}$ 425 is parallel to and opposing a first component (e.g., the Y-component) of the magnetic field to be measured $H_{applied}$ 450. The second nulling magnetic field $H_{null2}$ 426 is parallel to and opposing a second component (e.g., the X-component) of the magnetic field to be measured $H_{applied}$ 450. The first and second nulling magnetic fields $H_{null(1-2)}$ 425 and 426 together reduce Barkhausen noise and increase the dynamic range of the sensor.

In one implementation of this embodiment, first and second nulling currents 415 and 416 are applied to the first and second respective first drive straps 71 and 72 to generate the respective first and second nulling magnetic fields 425 and 426 in the magnetoresistive sensor 10 as follows: the second harmonic signal at the initial frequency is projected onto X and Y-components by amplifiers 233 and 234, respectively; the amplified second harmonic signals 330 and 331 are integrated to generate the second nulling current $I_{nulling2}$ 416 and the first nulling current $I_{nulling1}$ 415 that are respectively proportional to components (e.g., X and Y-components) of the extracted second harmonic components. Specifically, the first nulling current $I_{nulling1}$ 415 is input from the integrator 238 to the first drive strap 71; the second nulling current $I_{nulling2}$ 416 is input from the integrator 237 to the second drive strap 72. In this manner, the first and second nulling magnetic fields 425 and 426 that are opposing the magnetic field to be measured $H_{applied}$ 450 are generated in the magnetoresistive sensor 10. Block 814 is optional and occurs only if block 812 is implemented. At block 814, voltages $V_2$ and $V_1$ are measured across fixed, temperature stable resistors $R_2$ and $R_1$, through which the respective second and first nulling currents pass to determine the respective X and Y-components of the applied field.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A method to measure an applied magnetic field in a plane, the method comprising:
applying a first alternating drive current to a first strap, wherein at least a portion of the first strap overlays a magnetoresistive sensor, the first strap having a dimension extending in a first direction;
simultaneously applying a second alternating drive current to a second strap, wherein at least a portion of the second strap overlays the at least a portion of the first strap, the second strap having a dimension extending in a second direction, the second direction being non-parallel to the first direction, and the second alternating drive current being out of phase with respect to the first alternating drive current, wherein the magnetoresistive sensor is subjected to a periodically rotating magnetic drive field rotating in the plane in the magnetoresistive sensor; and when the applied magnetic field to be measured is superimposed on the periodically rotating magnetic drive field rotating in the plane, extracting a second harmonic component of an output voltage output from the magnetoresistive sensor, wherein the magnitude of the applied magnetic field to be measured in the plane is proportional to an amplitude of the extracted second harmonic component of the output voltage, and wherein the orientation of the applied magnetic field to be measured in the plane is related to a phase angle of the extracted second harmonic component of the output voltage.

2. The method of claim 1, further comprising:
outputting a signal indicative of an X-projection of the extracted second harmonic component of the output voltage; and
outputting a signal indicative of a Y-projection of the extracted second harmonic component of the output voltage.

3. The method of claim 2, wherein extracting the second harmonic component of the output voltage output from the magnetoresistive sensor comprises:
outputting the output voltage from the magnetoresistive sensor to a digital processor;
Fourier decomposing the output voltage at the digital processor;
inputting a reference signal at the initial frequency to the digital processor from a frequency generator; and
extracting the second harmonic component of the Fourier decomposed output voltage at the initial frequency.

4. The method of claim 2, wherein extracting the second harmonic component of the output voltage output from the magnetoresistive sensor comprises:
filtering an output voltage from the magnetoresistive sensor at a band pass filter;
inputting an output of the band pass filter to a phase sensitive detector;
inputting a reference signal at the initial frequency to the phase sensitive detector from a frequency generator; and
extracting the second harmonic component of the filtered output voltage at the phase sensitive detector.

5. The method of claim 1, further comprising:
applying a first nulling current to the first strap to generate a first nulling magnetic field in the magnetoresistive sensor, the first nulling magnetic field being parallel to and opposing a first component of the applied magnetic field to be measured; and
applying a second nulling current to the second strap to generate a second nulling magnetic field in the magnetoresistive sensor, the second nulling magnetic field being parallel to and opposing a second component of the applied magnetic field to be measured.

6. The method of claim 1, further comprising:
outputting a signal at an initial frequency from a frequency generator to a frequency divider;
frequency dividing the signal at the initial frequency to generate a signal at a drive frequency, the drive frequency being half of the initial frequency, wherein applying the first alternating current to the first strap comprises:
inputting the signal at the first alternating drive frequency to the first strap, wherein the first alternating drive current is alternating at the drive frequency, and wherein applying the second alternating current to the second strap comprises:

inputting the signal at the second alternating drive frequency to the second strap, wherein the second alternating drive current is alternating at the drive frequency.

7. The method of claim 1, further comprising:
tailoring a shape of the first alternating drive current applied to the first strap; and
tailoring a shape of the second alternating drive current applied to the second strap.

8. The method of claim 1, wherein applying the first alternating drive current to the first strap overlaying the magnetoresistive sensor and simultaneously applying the second alternating drive current to the second strap that overlays the first strap comprises one of:
applying the first alternating drive current to the first strap overlaying a magnetic tunnel junction and simultaneously applying the second alternating drive current to the second strap that overlays the first strap; or
applying the first alternating drive current to the first strap overlaying a giant magnetoresistance sensor, and simultaneously applying the second alternating drive current to the second strap that overlays the first strap.

9. A magnetoresistive sensor system to measure an orientation and a magnitude of a magnetic field in a plane, the magnetoresistive sensor system comprising:
a magnetoresistive sensor comprising a ferromagnetic free layer having a rotatable magnetization orientation, a ferromagnetic reference layer having a pinned magnetization orientation, and a barrier layer therebetween;
a first strap overlaying the magnetoresistive sensor to carry a first alternating drive current;
a second strap overlaying the magnetoresistive sensor to carry a second alternating drive current, the second alternating drive current being out of phase with respect to the first alternating drive current, wherein the second strap overlays a portion of the first strap, and wherein the magnetoresistive sensor is subjected to a periodically rotating drive field rotating in the plane.

10. The magnetoresistive sensor system of claim 9, further comprising:
a detection circuit to receive an output voltage output from the magnetoresistive sensor and to extract a second harmonic component of the output voltage, wherein the magnitude of the magnetic field to be measured is proportional to an amplitude of the extracted second harmonic component of the output voltage, and wherein the orientation of the magnetic field to be measured is simply related to a phase angle of the extracted second harmonic component of the output voltage.

11. The magnetoresistive sensor system of claim 10, wherein the detection circuit comprises:
a band pass filter to take as input the output voltage being output from the magnetoresistive sensor; and
a phase sensitive detector to take as input a sense voltage from the band pass filter and to take as input a reference signal from a frequency generator.

12. The magnetoresistive sensor system of claim 10, further comprising:
a feedback circuit to provide a first nulling current to the first strap and to provide a second nulling current to the second strap.

13. The magnetoresistive sensor system of claim 10, wherein the detection circuit comprises:
a digital processor to extract the second harmonic component of the Fourier decomposed output voltage and to output a signal indicative of an X-projection of the extracted second harmonic component of the output voltage and a signal indicative of a Y-projection of the extracted second harmonic component of the output voltage.

14. The magnetoresistive sensor system of claim 9, further comprising:
an insulating layer positioned between the ferromagnetic free layer and the overlaying drive field strap.

15. The magnetoresistive sensor system of claim 9, wherein the magnetoresistive sensor is a giant magnetoresistor.

16. The magnetoresistive sensor system of claim 9, wherein the magnetoresistive sensor is a magnetic tunnel junction.

17. The magnetoresistive sensor system of claim 9, further comprising:
a frequency generator to supply the first alternating drive current to the first strap and to supply the second alternating drive current to the second strap, wherein the magnetoresistive sensor, the first strap, the second strap, and the frequency generator are integrated on a silicon substrate.

18. The magnetoresistive sensor system of claim 9, wherein the magnetoresistive sensor, the first strap, and the second strap are integrated on a silicon substrate.

19. The magnetoresistive sensor system of claim 9, wherein the first strap has a dimension extending in a first direction, the second strap has a dimension extending in a second direction, the second direction being perpendicular to the first direction, and wherein the second alternating drive current is ninety degrees out of phase with respect to the first alternating drive current.

20. A magnetoresistive sensor system to detect a magnetic field, the magnetoresistive sensor system comprising:
a magnetoresistive sensor comprising a ferromagnetic free layer having a rotatable magnetization orientation, a ferromagnetic reference layer having a pinned magnetization orientation, and a barrier layer therebetween;
a first drive strap to carry a first alternating drive current at a drive frequency wherein at least a portion of the first strap overlays a magnetoresistive sensor, the first strap having a dimension extending in a first direction;
a second drive strap to carry a second alternating drive current at the drive frequency wherein at least a portion of the second drive strap overlays the at least a portion of the first strap, the second strap having a dimension extending in a second direction, the second direction being non-parallel to the first direction;
a generator to supply the first alternating drive current to the first drive strap and to supply the second alternating drive current to the second drive strap;
a detection circuit operable to:
input an output voltage from the magnetoresistive sensor,
input a reference signal at an initial frequency that is twice the frequency of the first and second drive alternating drive currents,
output a signal indicative of an X-projection of a second harmonic component of the output voltage; and
output a signal indicative of a Y-projection of the second harmonic component of the output voltage;
a first amplifier to amplify the signal indicative of the Y-projection of the second harmonic component of the output voltage;
a first integrator to integrate the amplified signal indicative of the Y-projection of the second harmonic component of the output voltage and to output a first nulling current to the first drive strap;
a first series resistor at the output of the first integrator, wherein a voltage drop across the first series resistor is proportional to proportional to the Y-component of an applied magnetic field;
a second amplifier to amplify the signal indicative of the X-projection of the second harmonic component of the output voltage;
a second integrator to integrate the amplified signal indicative of the X-projection of the second harmonic component of the output voltage and to output a second nulling current to the second drive strap; and
a second series resistor at the output of the second integrator, wherein a voltage drop across the second series resistor is proportional to proportional to the X-component of an applied magnetic field.

* * * * *